(12) United States Patent
Jeon et al.

(10) Patent No.: US 10,069,002 B2
(45) Date of Patent: Sep. 4, 2018

(54) BOND-OVER-ACTIVE CIRCUITY GALLIUM NITRIDE DEVICES

(71) Applicant: SEMICONDUCTOR COMPONENTS INDUSTRIES, LLC, Phoenix, AZ (US)

(72) Inventors: Woochul Jeon, Phoenix, AZ (US); Chun-Li Liu, Scottsdale, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/214,579

(22) Filed: Jul. 20, 2016

(65) Prior Publication Data

US 2018/0026123 A1    Jan. 25, 2018

(51) Int. Cl.
*H01L 29/778* (2006.01)
*H01L 29/20* (2006.01)
*H01L 29/417* (2006.01)
*H01L 23/535* (2006.01)

(52) U.S. Cl.
CPC ........ *H01L 29/7787* (2013.01); *H01L 23/535* (2013.01); *H01L 29/2003* (2013.01); *H01L 29/41758* (2013.01)

(58) Field of Classification Search
CPC ............... H01L 29/7787; H01L 23/535; H01L 29/2003; H01L 29/41758; H01L 29/778–29/7789; H01L 29/66431; H01L 29/66462; H01L 2924/13064; H01L 29/122–29/127; H01L 29/15–29/158; H01L 29/40–29/518; H01L 23/52–23/5389; H01L 27/085–27/098; H01L 21/768–21/76898; H01L 21/823475; H01L 23/522–23/53295
See application file for complete search history.

(56) References Cited

U.S. PATENT DOCUMENTS

| | | | |
|---|---|---|---|
| 6,313,512 B1* | 11/2001 | Schmitz | H01L 23/4824 257/341 |
| 8,455,951 B2* | 6/2013 | Kosaka | H01L 23/142 257/368 |
| 8,723,234 B2* | 5/2014 | Takada | H01L 21/8213 257/155 |
| 8,816,388 B2* | 8/2014 | Takada | H01L 29/41758 257/109 |
| 9,035,469 B2* | 5/2015 | Takagi | H01L 24/42 257/784 |
| 2007/0202360 A1* | 8/2007 | Chaudhari | H01L 29/7787 428/698 |
| 2010/0258844 A1 | 10/2010 | Lidow et al. | |

(Continued)

*Primary Examiner* — Scott B Geyer
(74) *Attorney, Agent, or Firm* — IPTechlaw

(57) ABSTRACT

Implementations of semiconductor devices may include: a first layer with a plurality of cells, each cell having a drain finger, a source finger and a gate ring; a second layer having a drain pad and a source pad, the drain pad having a width and a source pad having a width substantially the same as the drain pad; wherein a width of each drain finger of the first layer is wider than a width of each source finger of the first layer; and wherein each drain pad is coupled to each drain finger through a first contact and the source pad is coupled to each source finger through a second contact, where a width of the first contact is wider than a width of the second contact.

19 Claims, 13 Drawing Sheets

(56) References Cited

U.S. PATENT DOCUMENTS

| | | | |
|---|---|---|---|
| 2011/0057235 A1* | 3/2011 | Shim | H01L 23/4824 257/194 |
| 2012/0199847 A1* | 8/2012 | Takagi | H01L 29/0696 257/77 |
| 2012/0228632 A1* | 9/2012 | Takada | H01L 21/8213 257/77 |
| 2013/0062625 A1* | 3/2013 | Takada | H01L 29/41758 257/77 |
| 2013/0228788 A1* | 9/2013 | Yamamura | H01L 29/2003 257/76 |
| 2013/0228789 A1* | 9/2013 | Yamamura | H01L 29/2003 257/76 |
| 2013/0277687 A1* | 10/2013 | Kobayashi | H01L 29/42316 257/77 |
| 2014/0252416 A1* | 9/2014 | Takagi | H01L 29/0696 257/194 |
| 2015/0028427 A1* | 1/2015 | Yamamura | H01L 29/2003 257/401 |
| 2015/0349070 A1* | 12/2015 | Kawasaki | H01L 29/7827 257/329 |
| 2016/0056275 A1* | 2/2016 | Takagi | H01L 29/7786 257/76 |
| 2016/0172480 A1* | 6/2016 | Ogino | H01L 29/7786 257/192 |
| 2016/0204241 A1* | 7/2016 | Minoura | H01L 29/4236 257/76 |
| 2017/0062576 A1* | 3/2017 | Takagi | H01L 29/201 |

\* cited by examiner

BOND-OVER-ACTIVE CIRCUITY GALLIUM NITRIDE DEVICES

BACKGROUND

1. Technical Field

Aspects of this document relate generally to semiconductor devices. Specific implementations involve cascode devices.

2. Background

Conventionally, gallium nitride (GaN) devices are used for high power or high frequency semiconductor devices. Conventional GaN devices include source and drain fingers and are operated using a gate.

SUMMARY

Implementations of semiconductor devices may include: a first layer with a plurality of cells, each cell having a drain finger, a source finger and a gate ring; a second layer having a drain pad and a source pad, the drain pad having a width and a source pad having a width substantially the same as the drain pad; wherein a width of each drain finger of the first layer is wider than a width of each source finger of the first layer; and wherein each drain pad is coupled to each drain finger through a first contact and the source pad is coupled to each source finger through a second contact, where a width of the first contact is wider than a width of the second contact.

Implementations of semiconductor devices may include one, all, or any of the following:

The plurality of cells may be gallium nitride (GaN) high electron mobility transistors (HEMT).

Implementations of semiconductor devices may include: a first cell having a first plurality of fingers and a second cell having a second plurality of fingers; a first drain pad coupled to the first plurality of fingers; a second drain pad coupled to the second plurality of fingers; a source pad coupled to the first plurality of fingers and the second plurality of fingers; a gate bus located between the first plurality of fingers and the second plurality of fingers; and at least one gate pad coupled to the gate bus.

Implementations of semiconductor devices may include one, all, or any of the following:

The semiconductor device may further include a second gate pad coupled to the gate pad on an end of the gate bus opposing an end to which the at least one gate pad is coupled.

The source pad may be coupled to a substrate of a second transistor forming a cascode device.

The second transistor may be a silicon metal-oxide field effect transistor (Si-MOSFET) having a Si substrate.

The Si substrate of the Si-MOSFET may be coupled to a conductive film and the conductive film may be coupled to a drain of the Si-MOSFET.

Gate vias may be used to couple the source pad to the second transistor.

The gate bus and the gate pad may be covered in a passivation process/layer and the source pads and the drain pads may be open.

Implementations of semiconductor devices may include: a plurality of cells, each cell having at least one drain finger, at least one source finger and at least one gate; at least one drain pad; a plurality of source pads; and a gate bus coupled with the plurality of cells; and at least one gate pad coupled to the gate bus; wherein the drain pad is coupled to the at least one drain finger of each of the plurality of cells; and wherein each of the plurality of source pads is coupled to at least one source finger of each of the plurality of cells.

Implementations of semiconductor devices may include one, all, or any of the following:

The plurality of cells may be gallium nitride (GaN) high-electron mobility transistors (HEMT).

The plurality of cells may include a first group having a first length and a second group having a second length that is longer than the first length of the first group.

The at least one drain pad may be positioned over the second group of cells having the second length.

A second drain pad may be positioned opposite the at least one drain pad with the plurality of source pads between, the second drain pad coupled to the at least one drain pad through at least one drain bus.

The gate bus may be located under the plurality of source pads.

The plurality of source pads may be electrically coupled together during packaging.

The plurality of source pads may be coupled to one another through wire bonding.

Implementations of semiconductor devices may include: a first metal layer having an active area and a non-active area; and a second metal layer having at least one drain pad, at least one source pad and at least one gate pad; wherein the active area includes a plurality of source fingers and a plurality of drain fingers interdigitated with one another; and at least one gate finger; wherein the drain pad is coupled to the plurality of drain fingers at one end of the plurality of drain fingers; wherein the drain pad is located only in the non-active area of the first metal layer; and wherein the first metal layer is electrically coupled to the second metal layer.

Implementations of semiconductor devices may include one, all, or any of the following:

The plurality of drain fingers may be coupled together at one end.

The semiconductor device may further include a single contact between the drain pad and the plurality of drain fingers.

The source pad may be located only in the active area of the first metal layer.

The semiconductor device may further include a second source pad and wherein the drain pad may be located between the source pad and the second source pad.

The semiconductor device may further include a second drain pad and wherein the source pad may be located between the drain pad and the second drain pad.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor devices and implementing components and methods, consistent with the intended operation and methods.

Figure 1A:
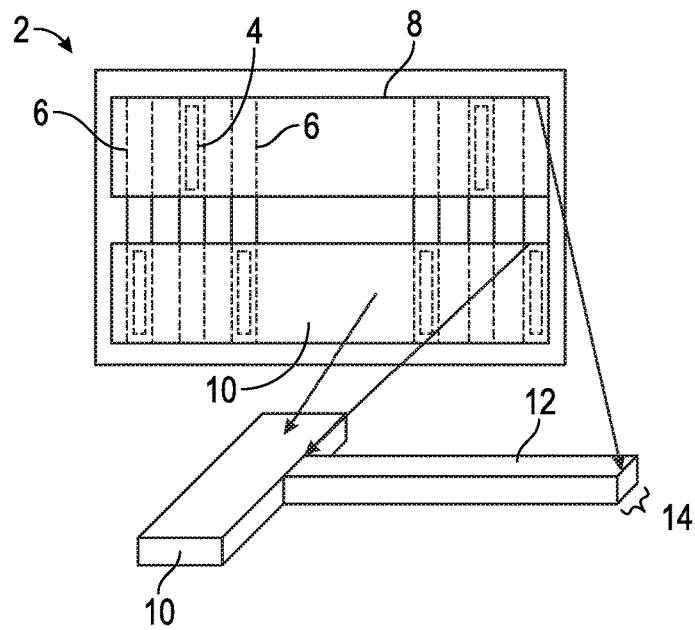
FIG. 1A-1C show the relationship between finger length and voltage in a bond-over-active (BOA) device implementation.

Referring to FIG. 1A, an implementation of a conventional device bond over active (BOA) gallium nitride (GaN) high electron mobility transistor (HEMT) device 2 is illustrated. A typical BOA device has a first layer with alternating drain fingers 4 and source fingers 6 and a second layer with a drain pad 8 coupled to the drain fingers 4 and a source pad 10 coupled to the source fingers 6. The length of a finger (Lf) 12 is measured from the top of one pad to the top of the next pad. For example, the length of finger 12 is measured from the top of the source pad 10 to the top of the drain pad 10.

The finger length of the drain and source is an important parameter that influences chip size and on resistance ($R_{on}$) of the device, especially for BOA devices. Shorter finger length and lower finger metal resistance may improve current capacity of a device. Because of difficulties in fabrication, the thin metal process, conventional finger lengths are not long enough to achieve a Ron of less than 100 milliOhms (mOhm). To achieve a longer finger length, thicker metal processes can be used but there is a limitation to the thickness that can be used because the inter-metal dielectric (IMD) process involved can be very complicated.

Figure 1B:
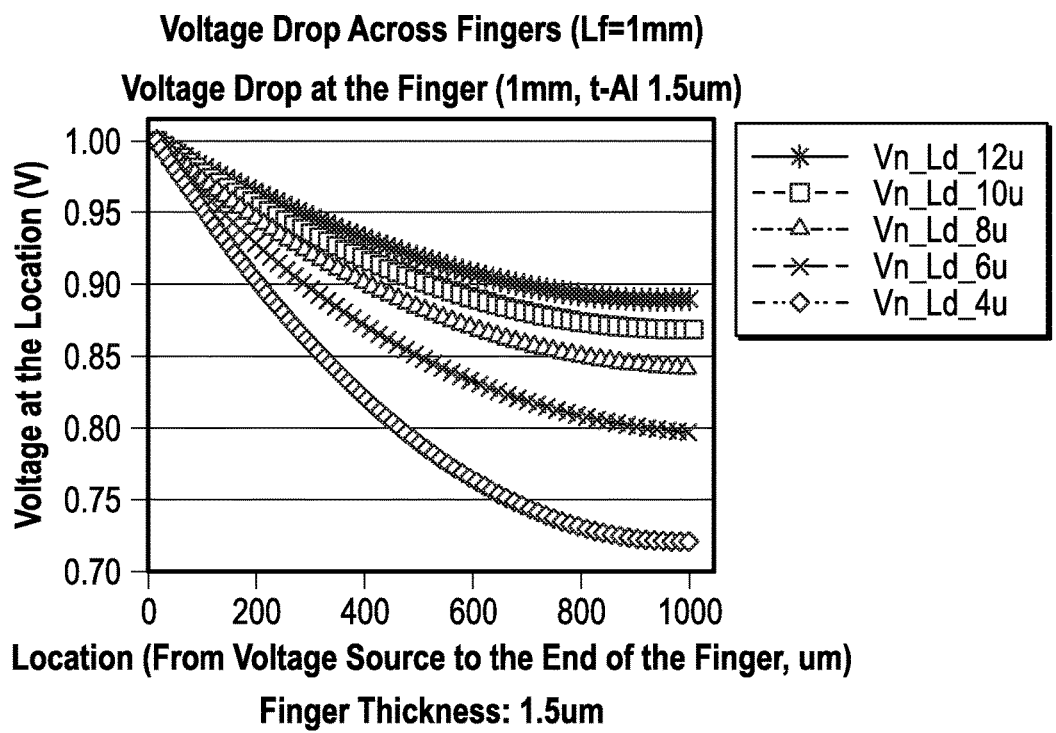
Figure 1C:
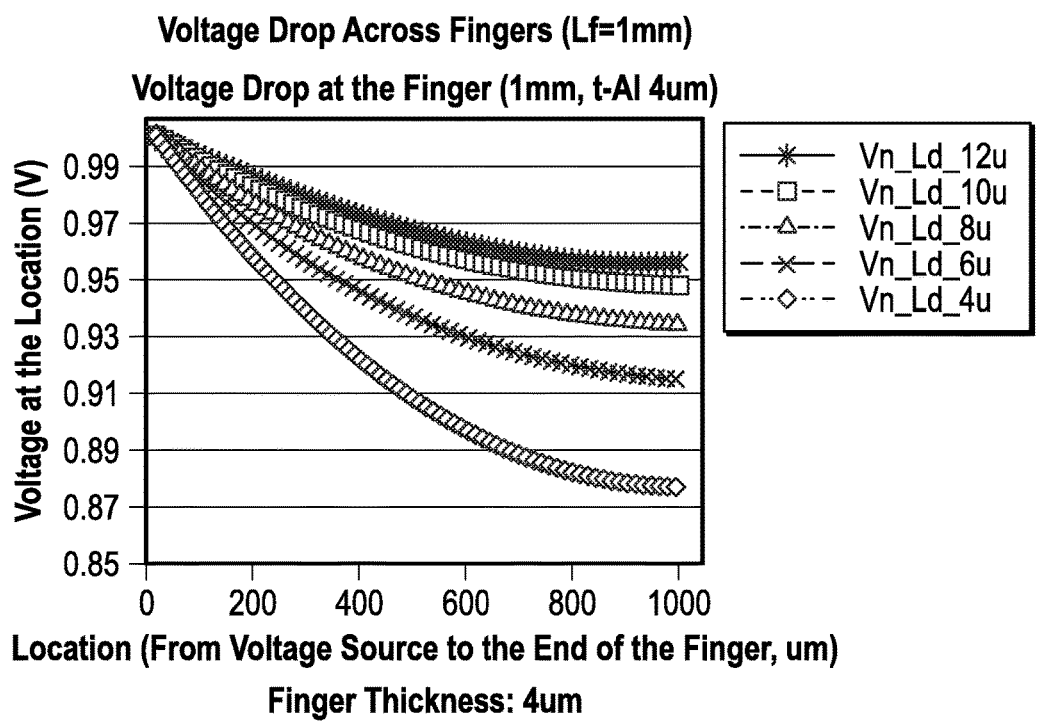

Referring now to FIG. 1B, a graph of the voltage drop across the fingers of a conventional device is illustrated with a finger thickness of 1.5 microns. The graph illustrates the change in voltage drops as the width of the finger is increased from 4 microns to 12 microns. Voltage drop can be improved as the Ron is improved. If a 1.5 micron thick and a 4 micron wide metal finger is used, the finger length is limited to approximately 300 microns if nor more than a 10% voltage drop at the end of the finger is desired. If the finger width is 10 microns, the finger length can be approximately 500 microns. Increasing the finger thickness may help to decrease the voltage drop for the same finger length. Referring to FIG. 1C, for example, the voltage drop across fingers with a thickness of 4 microns is illustrated. This graph illustrates a smaller voltage drop across the same length and width of fingers as illustrated in FIG. 1B. As described above, there is a limit to increasing the thickness of the fingers to achieve an equivalently longer finger length because the IMD process involved can be very complicated.

Figure 2:
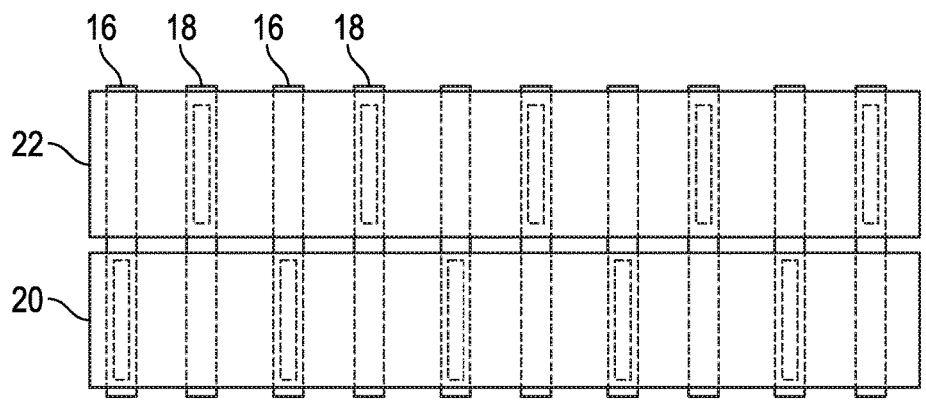
FIG. 2 is a top view of a conventional BOA device.
Figure 3A:
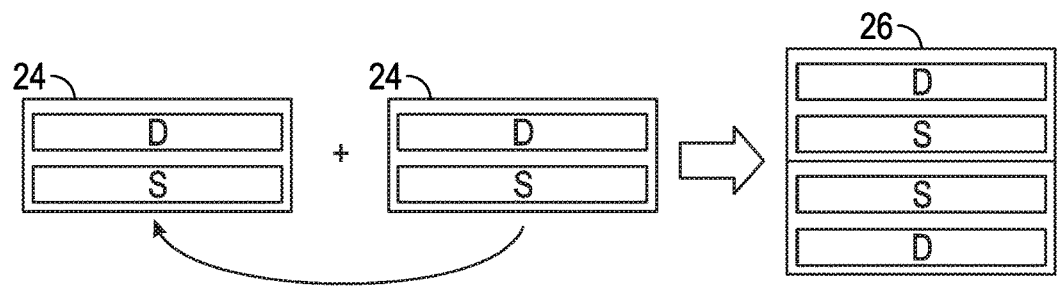
FIG. 3A is a schematic of an implementation of a semiconductor device having a drain-source-drain (DSD) pad.
Figure 3B:
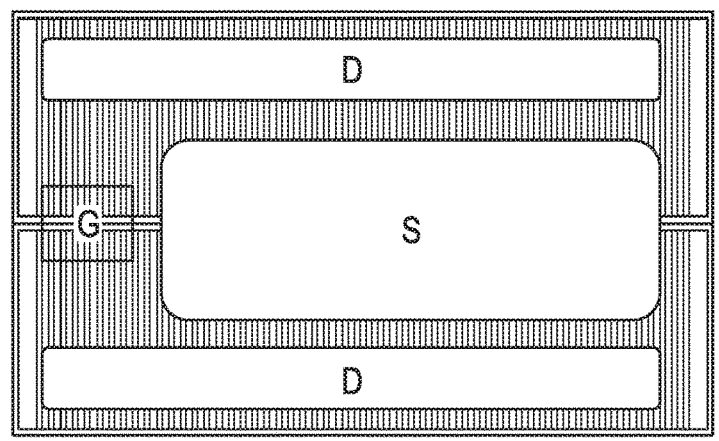
FIGS. 3B and 3C are top views of implementations of semiconductor devices having a DSD pad.
Figure 3C:
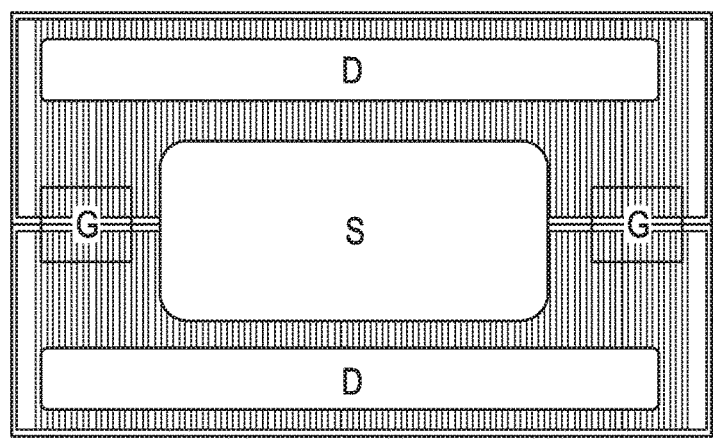

Referring to FIG. 2, a conventional device having a BOA structure using a double metal process is illustrated. On the first metal layer there are source fingers 16 and drain fingers 18. On the second metal layer there are source pads 20 and drain pads 22. For example, to achieve low resistance between the drain and source when the device is on (Rdson), the finger length must be shorter than 1 mm for a finger having a width of 6 µm and thickness of 4 µm. A longer finger length may be achieved by increasing the size of the source pad. For example, referring now to FIG. 3A, a 60 mOhm device 26 may be created by connecting two 120 mOhm devices 24. This leads to a drain-source-drain (DSD) pad structure having a large source pad and two drain pads on either side as illustrated in FIGS. 3B and 3C. By non-limiting example, FIGS. 3B and 3C illustrate at least two configurations of gates that may be utilized with a DSD pad structure.

Figure 4A:
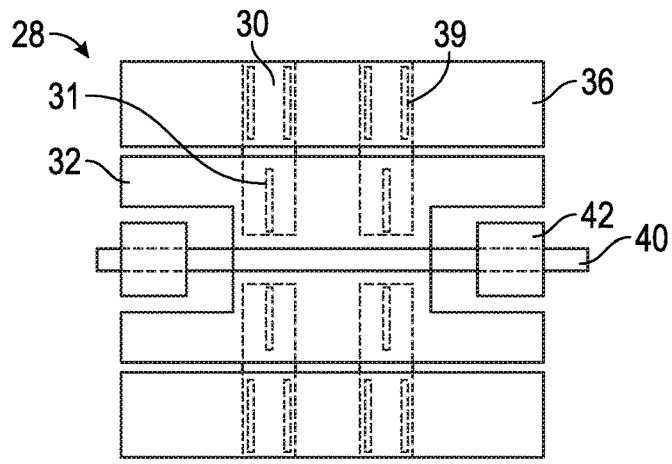
FIG. 4A is a top view of another implementation of a semiconductor device having a BOA structure.
Figure 4B:
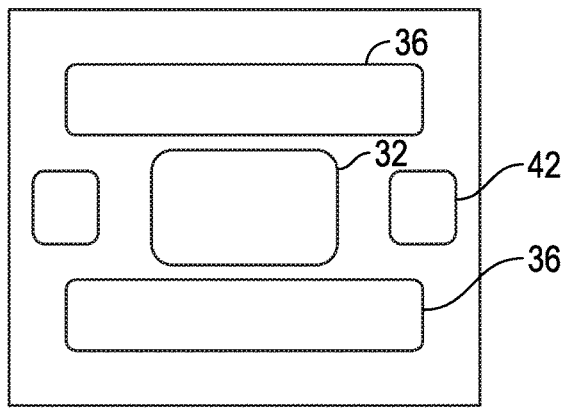
FIG. 4B is a top view of the pad layer from the semiconductor device in FIG. 4A.
Figure 4C:
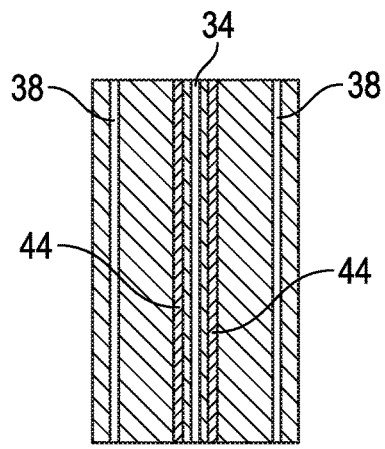
FIG. 4C is a top view of the high electron mobility transistor (HEMT) cell from the semiconductor device in FIG. 4A.

Referring now to FIGS. 4A and 4C, an implementation of a semiconductor device having a DSD pad structure 28 is illustrated. On the device layer, two GaN HEMT cells 30 with short fingers are positioned back to back in series. The large source pad 32 of the DSD pad connects the source fingers 34 of the two GaN cells 30 through contacts. The source pad 32 is coupled to the source fingers 34 through contacts 31 between the ohmic metal and pad metal. The drain pads 36 located on either side of the source pad 32 are coupled to the drain fingers 38 of the HEMT cells 30 through contacts 39. A gate bus 40 is located between the HEMT cells 30 and is coupled to the gate pads 40 located on either side of the source pad 32. Referring now to FIG. 4B, a view of the DSD pad structure of FIG. 4A is illustrated. The drain pads 36 are located above and below the source pad 32. The gate pads 42 are located to the right and left of the source pad 32. Referring to FIG. 4C, a single GaN HEMT cell is illustrated. The drain fingers 38 are located near the edges of the cell. The source finger 34 is located in the middle of the cell. The gate fingers 44 are located to the right and left of the source finger 34.

Figure 5A:
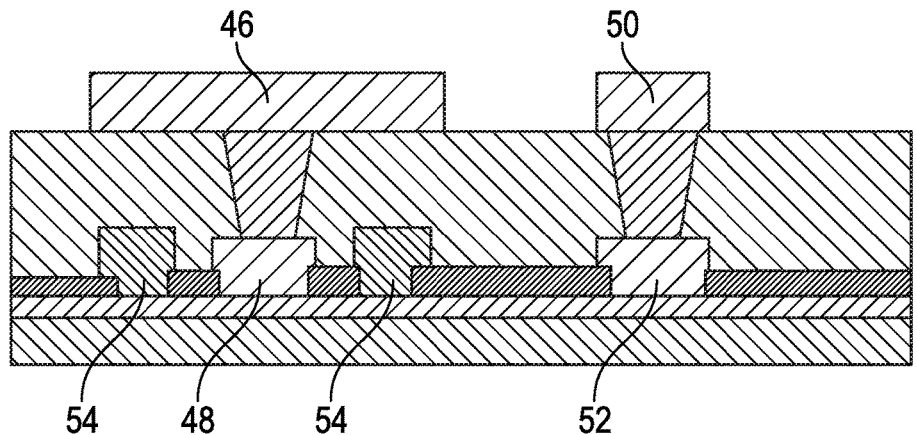
FIG. 5A is a cross sectional view of a conventional transistor.
Figure 5B:
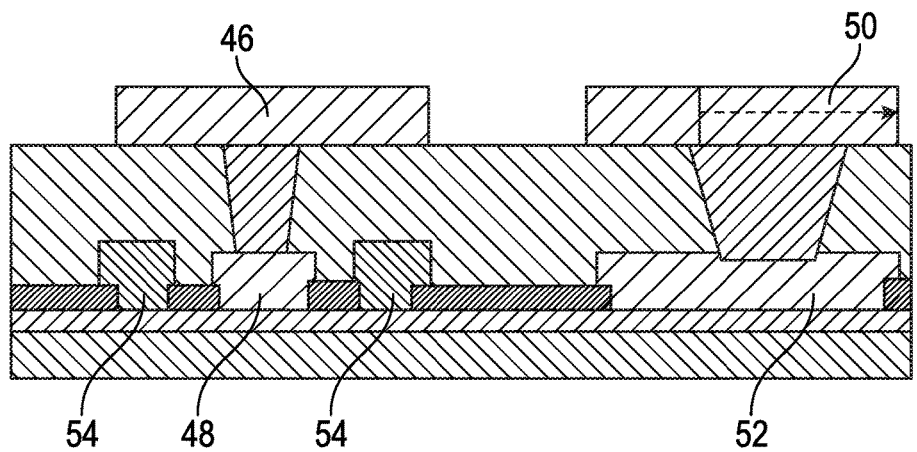
FIG. 5B is a cross sectional view of an implementation of a transistor with an enlarged drain contact.

Referring now to FIG. 5A-5B, a cross-sectional view of the contacts of a transistor cell implementation is illustrated. In FIG. 5A, a conventional device is illustrated. Conventionally, increasing the size of the contacts is one way to lower the resistance of the fingers. The source ohmic contact 48 to the channel of the source finger 46 is wider than that of the drain ohmic contact 52 of the drain finger 50. This is because the source finger can extend over the gate fingers 54 as well as over the source contact. The drain finger 50 is limited by the size of the drain contact 52. By extending the drain ohmic contact length 38, the width of the drain finger ohmic contact 52 can be increased. With a wider drain contact length 52, the width of the drain finger 50 can be increased to be substantially the same or the same as the width of the source finger 46. Widths that are substantially the same are similar or essentially the same in size. By non-limiting example, one way to increase the length of the drain finger is to connect two HEMT cells in series as illustrated in FIG. 4A. Increasing the width of drain finger may require a wider drain contact 50 because of the high potential at the edge of the extended drain metal. Referring now to FIG. 5B, the drain contact is increased to increase the finger 50 of the drain region (see the dotted arrow in the figure) and the drain contact 52 can be widened. This process limits current crowding.

Figure 6A:
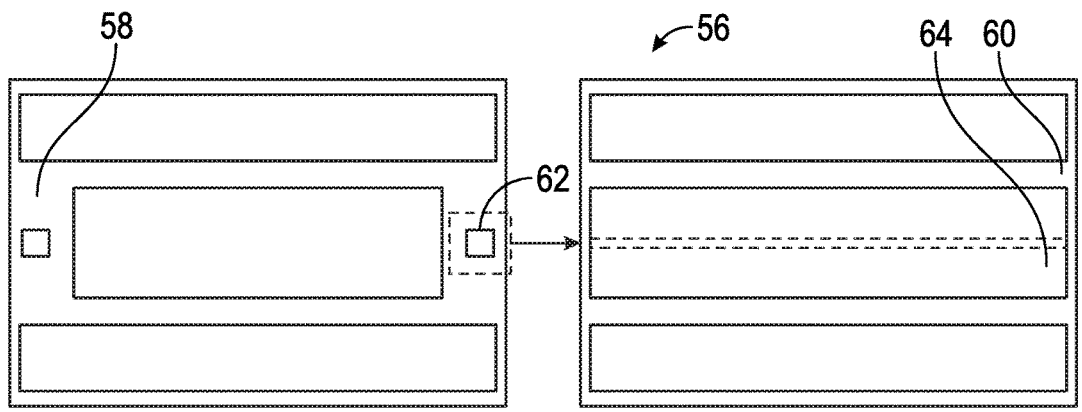
FIG. 6A is a top view of an implementation of a semiconductor device having a DSD BOA structure with a gate via to a silicon substrate.
Figure 6B:
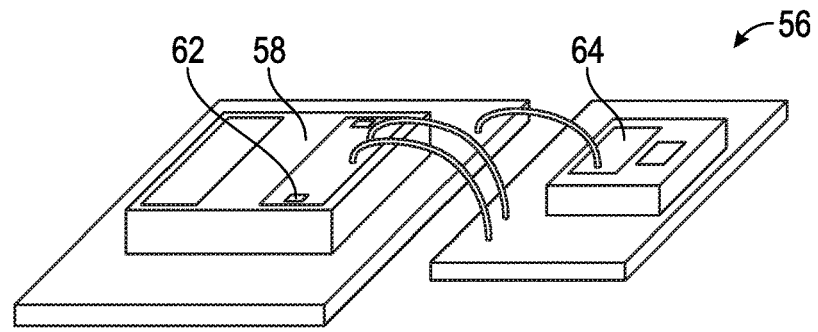
FIG. 6B is a perspective view of an implementation of a cascode using an implementation of the device illustrated in FIG. 6A.

Referring now to FIGS. 6A and 6B, an implementation of a semiconductor device having a DSD BOA pad structure with a gate via to a silicon substrate is illustrated. The DSD BOA pad 58 can couple to a silicon metal-oxide semiconductor field effect transistor (MOSFET) device by a through via. The gate 62 of the DSD device 58 is connected to the substrate/source 64 of a Si-MOSFET to create a cascode device 56. This combination forming a cascode device provides a gate for the Si-MOSFET device.

Figure 7A:
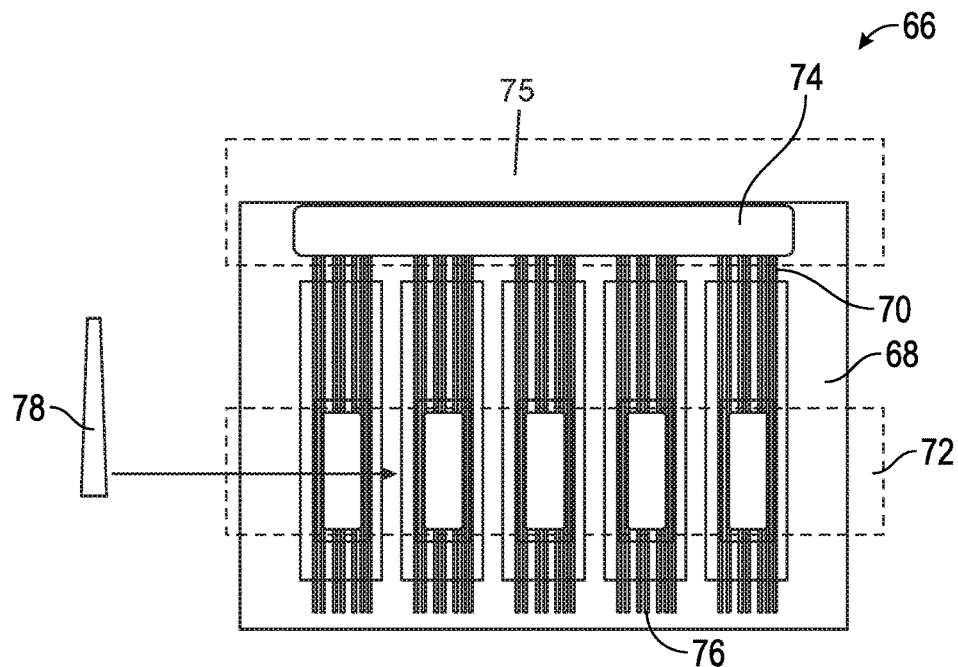
FIG. 7A is a top view of an implementation of semiconductor having a multi-source BOA pad.
Figure 7B:
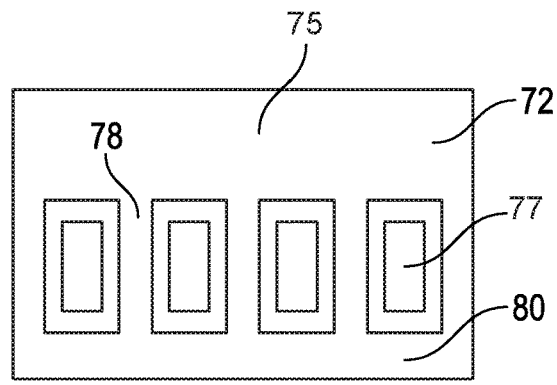
FIG. 7B is a top view of the pad from FIG. 7A.

Referring now to FIG. 7A, an implementation of a semiconductor device 66 having a multi-source BOA pad is illustrated. This BOA structure may be implemented when using longer fingers in the cells of transistors. Shorter fingers may be useful in lowering the on resistance of a device but longer fingers help to make the aspect ratio of the device better. For example, if the maximum finger length used is 1 mm due to the limited metal thickness, the aspect ratio of 100 mOhm device can be higher than 3:1 (and a 50 mOhm device has 6:1 aspect ratio), which cannot be used for actual manufacturing. In this view, the first metal layer (M1) 68 can be seen having a plurality of cells 70 each having a drain finger, a source finger and a gate. The second metal layer (M2) 72 and 75 of the device 66 has a first drain pad having as opening 74 and multiple isolated source pads having openings 76. The first drain pad opening 74 couples to the drain fingers 70 of the M1 layer 68 and the source pad openings 76 couple to each of the source fingers 70 of the M1 layer 68. In various implementations, the plurality of cells 70 may include a first group and a second group, the second group having a longer length than the first group. The first drain pad opening 74 may couple to the second group of drain fingers having the longer length. There may be, in various implementations, a second drain pad on the M2 layer. This second drain pad does not couple directly to the M1 layer, rather the second drain pad is connected to the first drain pad through drain fingers 78 on the M2 layer located between the source pads 76. These M2 drain fingers 78 may be non-rectangular in shape for better current spreading. The multiple isolated source pads may be coupled during the packaging process by wire bonding, clip bonding, or any suitable bonding known in the art. Referring now to FIG. 7B, a top down view of the M2 layer 72 of the device is illustrated. The first drain pad 75, drain fingers 78 and second drain pad 80 are coupled together. The source pads 77 are located between the drain finger 78.

Figure 8A:
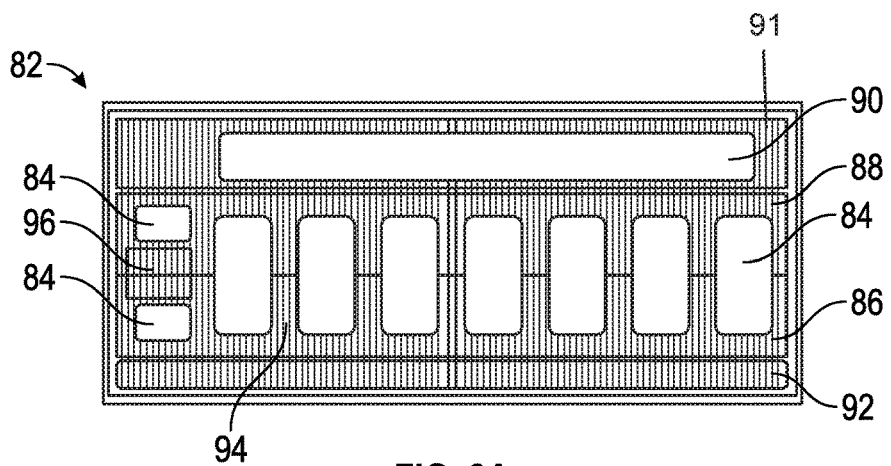
FIG. 8A-8C are examples of different implementations semiconductor devices having multi-source BOA pads.
Figure 8B:
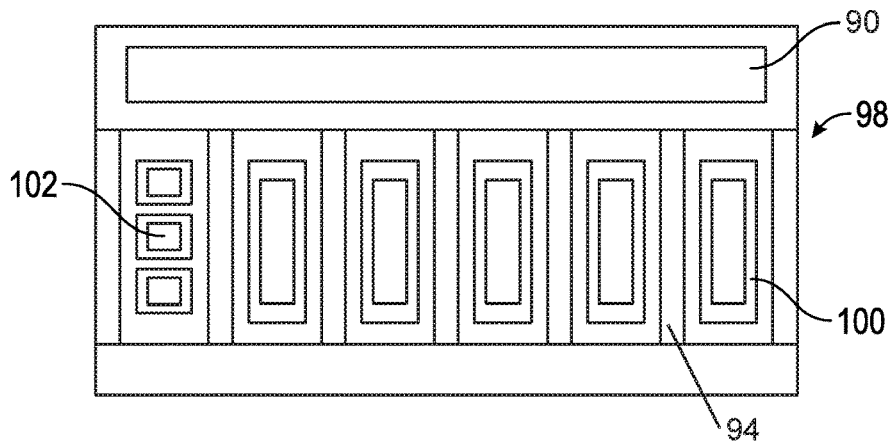
Figure 8C:
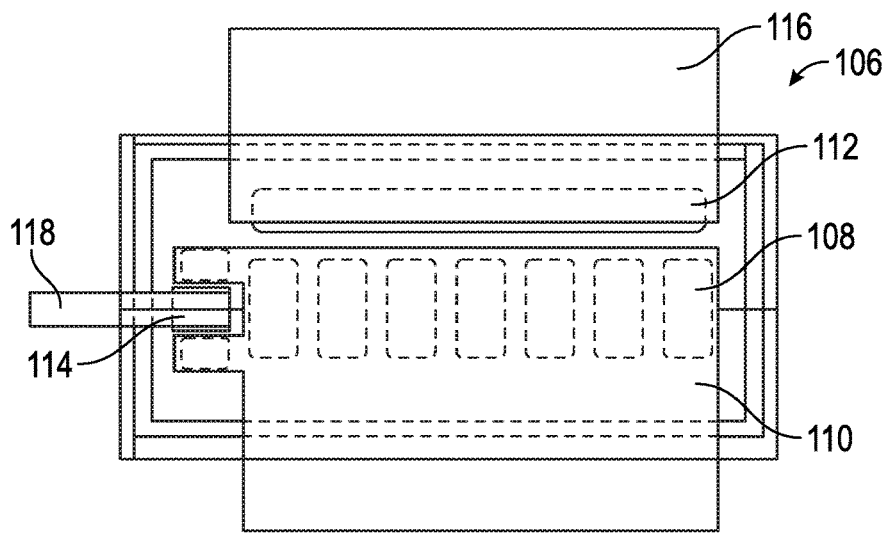

Referring now to FIGS. 8A-8C, various implementations of semiconductor devices with multi-source pads are illustrated. Referring to FIG. 8A, a semiconductor device 82 with nine source pads 84 is illustrated. A first group 86 of a plurality of cells/fingers having a first length and a second group 88 of a plurality of cells/fingers having a second length is illustrated. The second length 88 is longer than the first length 86. At least one drain pad 91 is positioned over the second, longer groups of cells 88. A second drain pad 92 is positioned opposite the at least one drain pad 91 with the plurality of source pads 84 between the drain pads 92 and 91. The second drain pad 92 is coupled to the at least one drain pad 91 through at least one drain bus 94. The drain pads 91 and 92 are coupled to the cells/fingers 88 and 86 through the drain pad opening 90. A gate bus (hidden under the pad structures) is located under the plurality of source pads 84 and is coupled to a gate pad 96 located near the source pads.

Referring to FIG. 8B, an implementation of a multi-source pad metal layout 98 is illustrated. In this particular layout implementation, the M1 layer is shown having seven source pads 100 open for bonding and one gate pad 102. Referring to FIG. 8C, an implementation of a semiconductor package 106 is illustrated. The multiple source pads 108 may be electrically coupled together by a wire 110, a clip and any similar method known in the art. The drain pad 112 and the gate pad 114 may each be packaged with, by non-limiting example, wires 116 and 118, clips and similar methods.

Figure 9A:
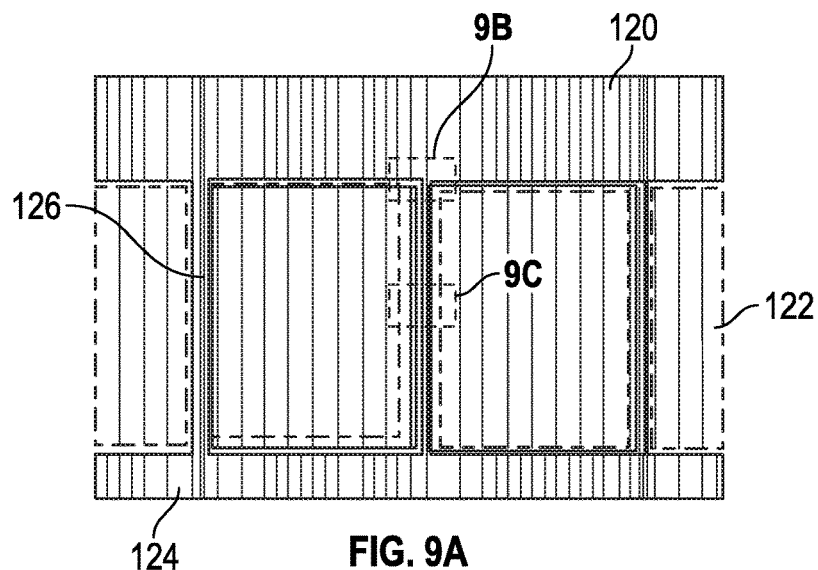
FIG. 9A-9C are enlarged views of a semiconductor device having a multi-source BOA pad.
Figure 9B:
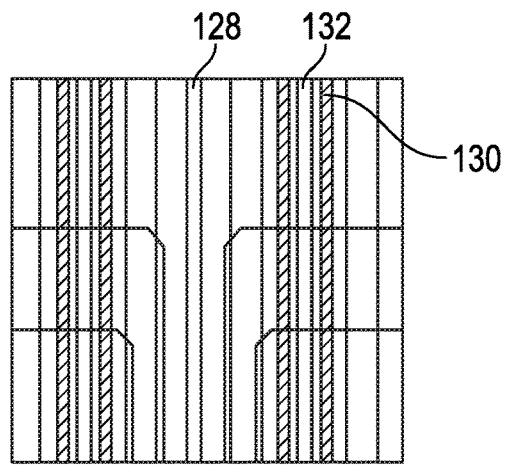
Figure 9C:
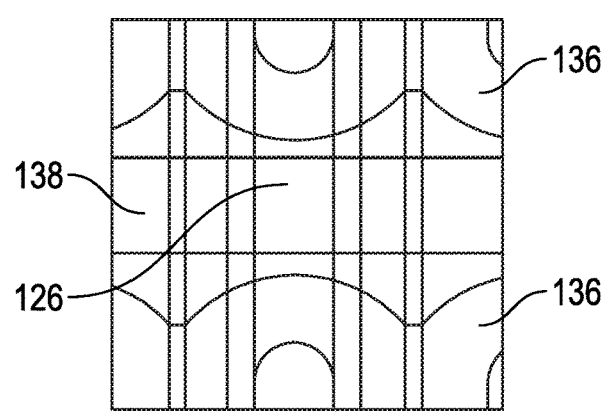

Referring now to FIGS. 9A-9C, an enlarged view of the device from FIG. 8A is illustrated. In FIG. 9A, a portion of the at least one drain pad 120, two full and two partial source pads 122, a portion of the second drain pad 124, and the drain buses 126 coupling the second drain pad 124 to the drain pad 120 is illustrated. In FIG. 9B, an enlarged view of a portion of FIG. 9A showing the plurality of fingers of the semiconductor device 82 is illustrated. In this view, a drain finger 128 of the device is visible. A gate 130 is located near the source finger 132. Referring to FIG. 9C, another enlarged view is illustrated. In this view, the drain feed 126 coupling the at least one drain pad 120 and the second drain pad 124 is illustrated. The contacts 136 coupling the open drain pad 120 and source pads 122 to the plurality of fingers 88 and 86 are also visible. The gate bus 138 is illustrated under the source pads 122.

Figure 10A:
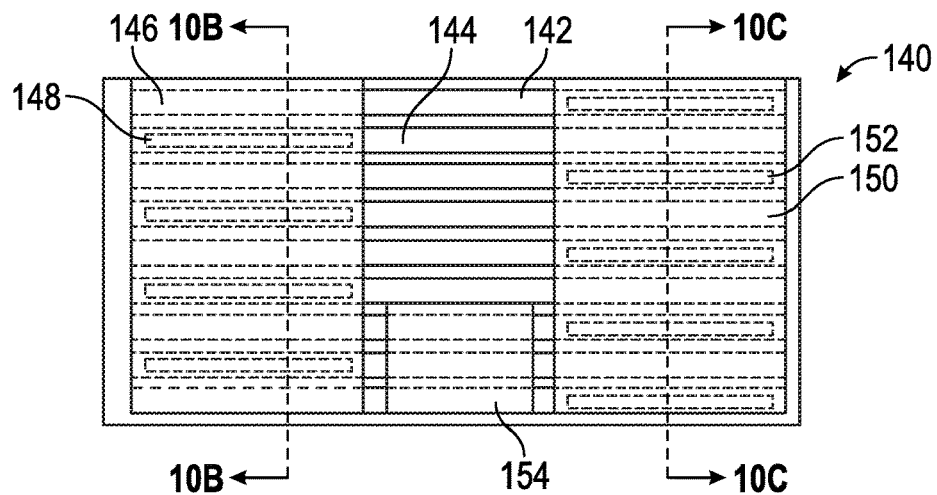
FIG. 10A is an implementation of a conventional semiconductor device having a BOA structure.
Figure 10B:
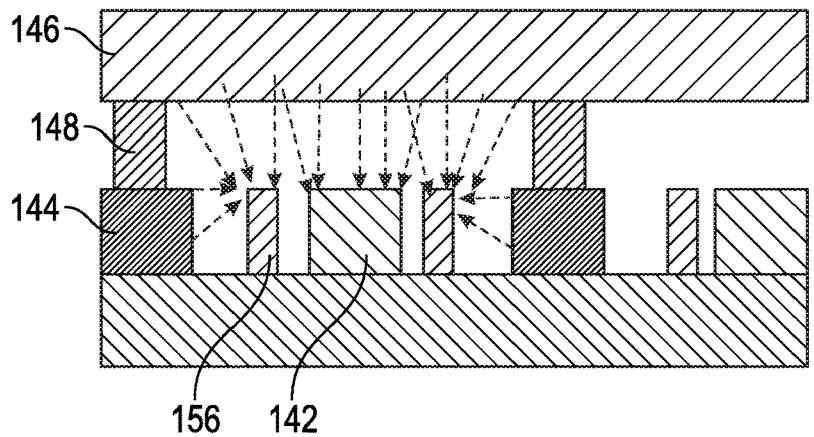
FIG. 10B-10C are schematics showing the concentration of electric fields in an implementation of a semiconductor device having a conventional BOA structure.
Figure 10C:
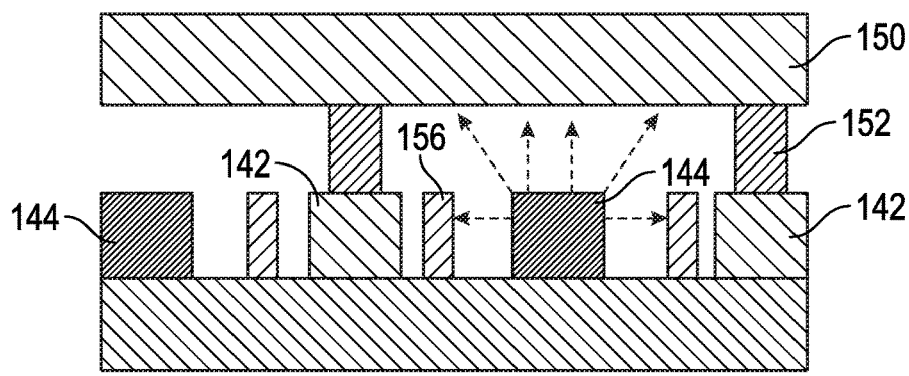

Referring now to FIG. 10A-10C, a conventional semiconductor device 140 having a BOA pad structure is illustrated. This device has interdigitated source fingers 142 and drain fingers 144. A drain pad 146 is coupled to the drain fingers 144 through contacts 148. A source pad 150 is coupled to the source fingers 142 through contacts 152. In this particular implementation, a gate pad 154 is positioned between the drain pad 146 and source pad 150. In various implementations of a BOA design, the gate pad may be located anywhere near the source pad in other orientations other than the one illustrated in the figures. As illustrated in FIG. 10B, there is a high electric field concentration on the edge of the source fingers 142 and the gate 156 due to the high electrical potential of the drain region of the device 140. As illustrated in FIG. 10C, the source pad 150 may act as a field plate to relieve the electric field at the edge of the source finger 142 or gate 156.

Figure 11A:
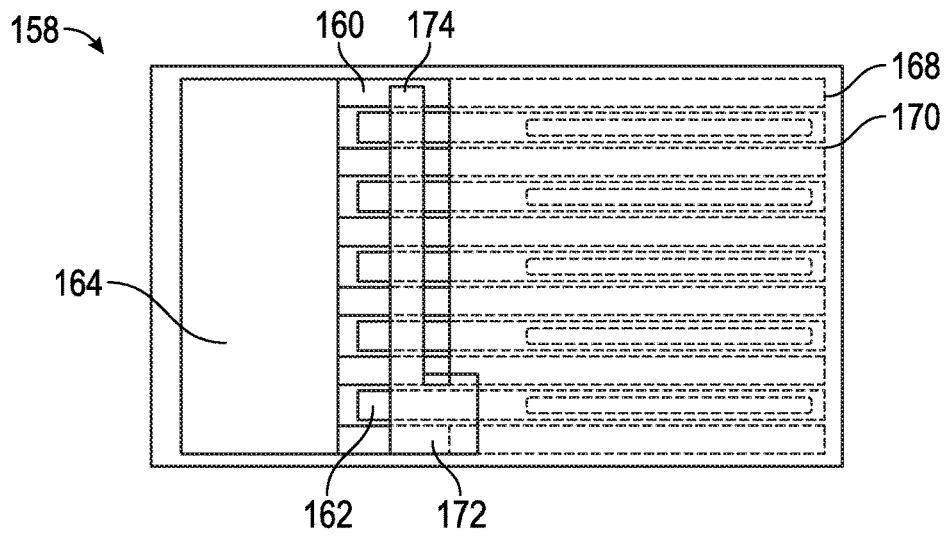
FIG. 11A is a top view of an implementation of a semiconductor device having a semi-BOA structure.
Figure 11B:
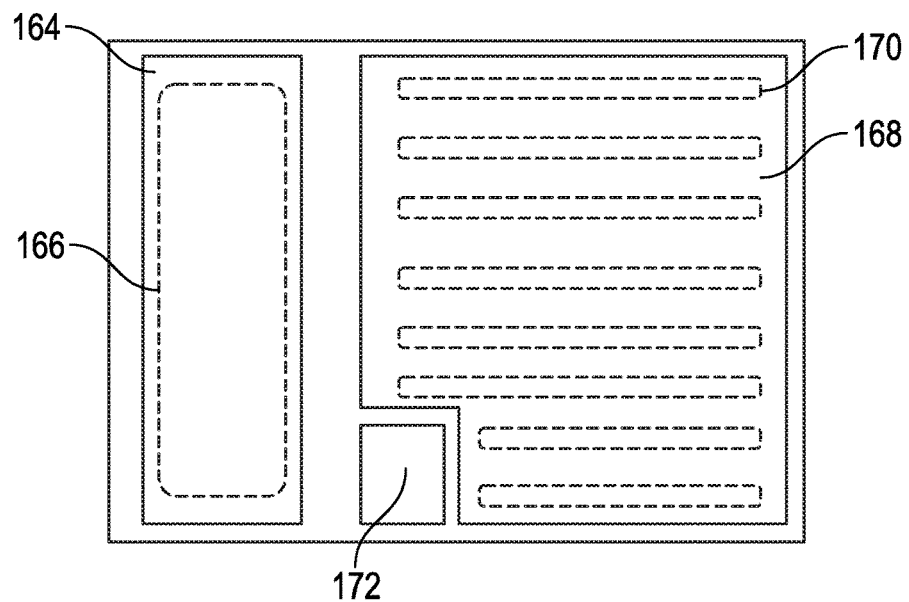
FIG. 11B is a schematic of a top view of the device from FIG. 11A.
Figure 11C:
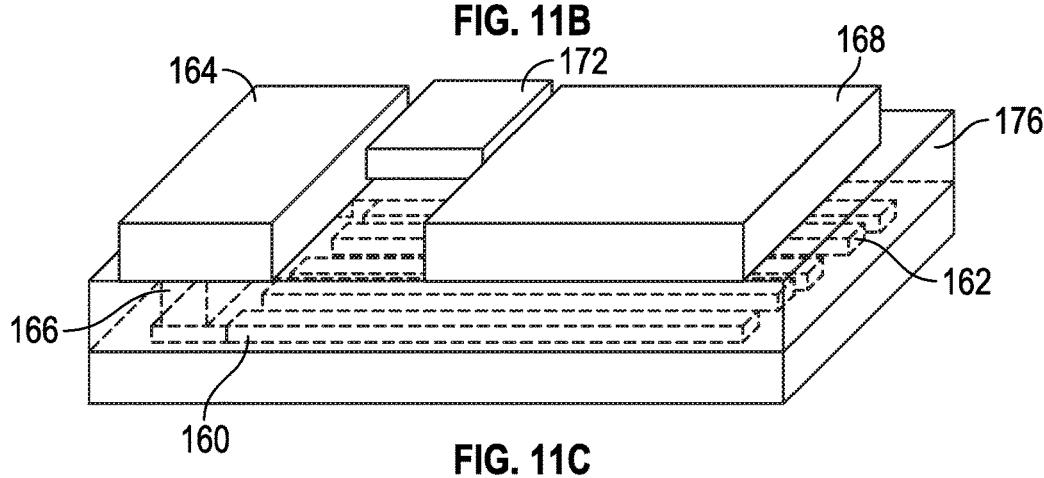
FIG. 11C is a top perspective view of an implementation of a semiconductor device having a semi-BOA structure.

Referring now to FIGS. 11A-11C, an implementation of a semiconductor device 158 having a semi-BOA design is illustrated. The device 158 has a first layer having interdigitated drain fingers 160 and source fingers 162. A drain pad 164 is located over a non-active area of the device 158 and is coupled to the drain fingers 160 through a single contact 166. However, in various implementations, single or multiple vias may also be used. A source pad 168 is located in the active area of the device 158. The source pad 168 is coupled to the source fingers 162 through contacts 170 electrically coupling each source finger 162 to the source pad 168. A gate pad 172 is located between the drain pad 164 and the source pad 168. The gate pad is coupled to a gate bus 174. Referring to FIG. 11C, a three dimensional perspective view of an implementation of the device 158 is illustrated. In this view, the intermetal dielectic (IMD) between the fingers 160 and 162 and pads 164, 168 and 172 is visible and part of the source pad 168 has been removed to show structure.

A semi-BOA design may involve a less difficult manufacturing process because the IMD layer can be thinner when the source pad 168 acts as a field plate. This design may also provide a better pad layout for packaging and better current spreading than a non-BOA device because the fingers can be thinner and shorter. With this design it may be possible to stack a silicon field effect transistor (Si-FET) die/device on the source pad 168. This design may allow for a less complicated and more reliable IMD process than a full-BOA device 140. Table 1 below shows the advantages of a semi-BOA structure comparted to both a non-BOA and full BOA structure. Though the active area is smaller in a semi-BOA structure than a full-BOA structure because the dielectric is thinner, the IMD process is less complicated and the device is more reliable.

TABLE 1

|  | Non BOA | Semi BOA | BOA |
|---|---|---|---|
| Active area | ~60% | ~70% | ~85% |
| IMD | <1 um | 2~3 um | >3 um |
| Finger size | ~10 um | ~5 um | 2~5 um |
| Si FET stack | NA | OK | OK |
| Clip pkg | . . . | OK | OK |

Figure 12A:
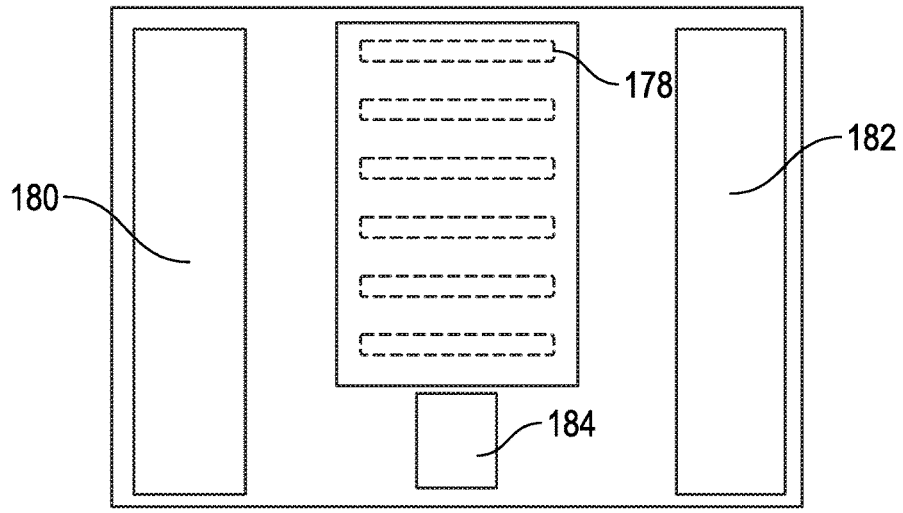
FIG. 12A is a top view of an implementations of a semiconductor device having a semi-BOA structure.
Figure 12B:
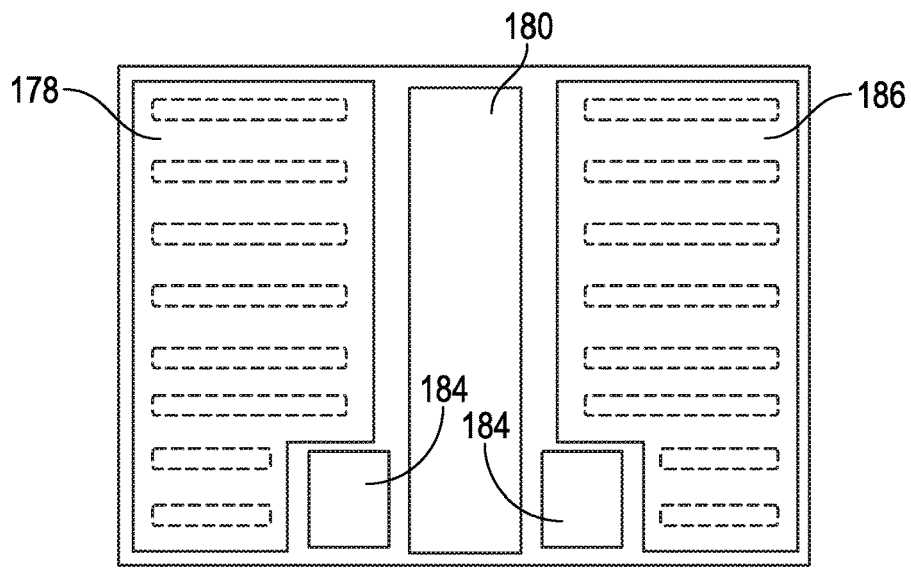
FIG. 12B is a top view of another implementation of a semiconductor device having a semi-BOA structure.

Referring now to FIGS. 12A and 12B, possible layouts of semi-BOA semiconductor device implementations are illustrated. In FIG. 12A, the source pad 178 is located between the drain pad 180 and a second drain pad 182. The gate pad 184 is located adjacent to the source pad 178. Referring to FIG. 12B, the drain pad 180 in this implementation is located between the source pad 178 and a second source pad 186. In this implementation there are two gate pads located on either side of the drain pad 180 and between the two source pads 178 and 186. In both implementations, FIG. 12A and FIG. 12B, the drain pads are located over the non-active area of the first layer.

Figure 13A:
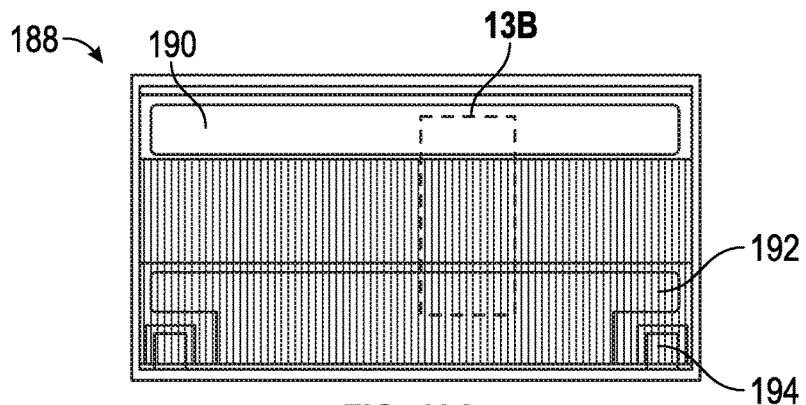
FIG. 13A is an implementation of a semiconductor device having a semi-BOA structure.
Figure 13B:
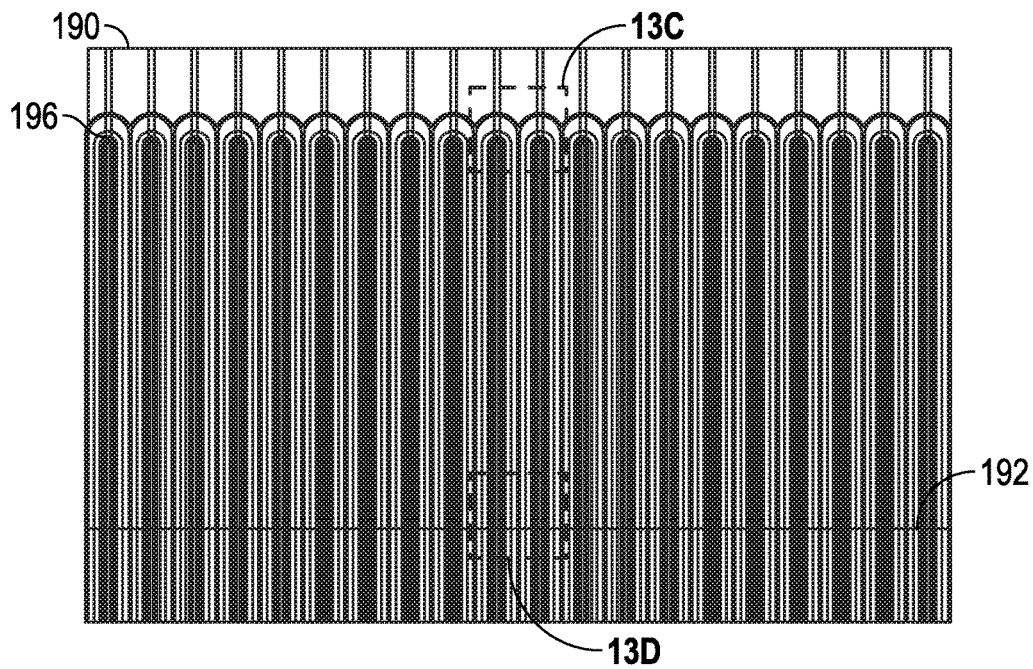
FIG. 13B is an enlarged view of a section of the device from FIG. 13A labeled 13B.
Figure 13C:
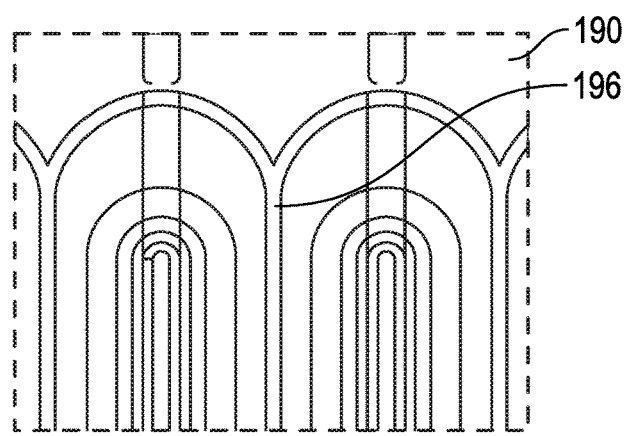
FIG. 13C is an enlarged view of a section of the device from FIG. 13B labeled 13C.
Figure 13D:
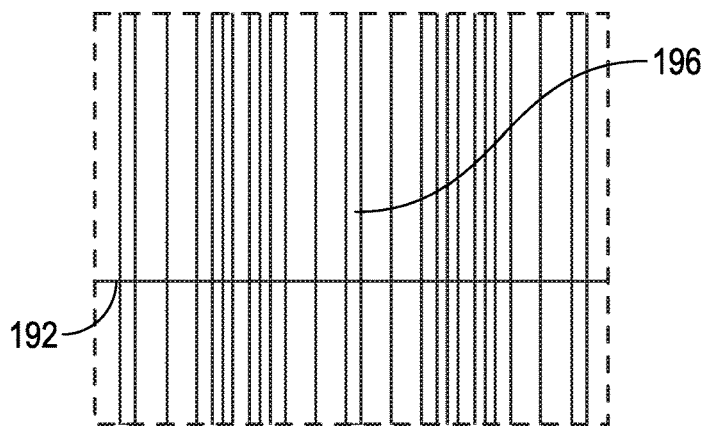
FIG. 13D is an enlarged view of a section of the device from FIG. 13B labeled 13D.
Figure 13E:
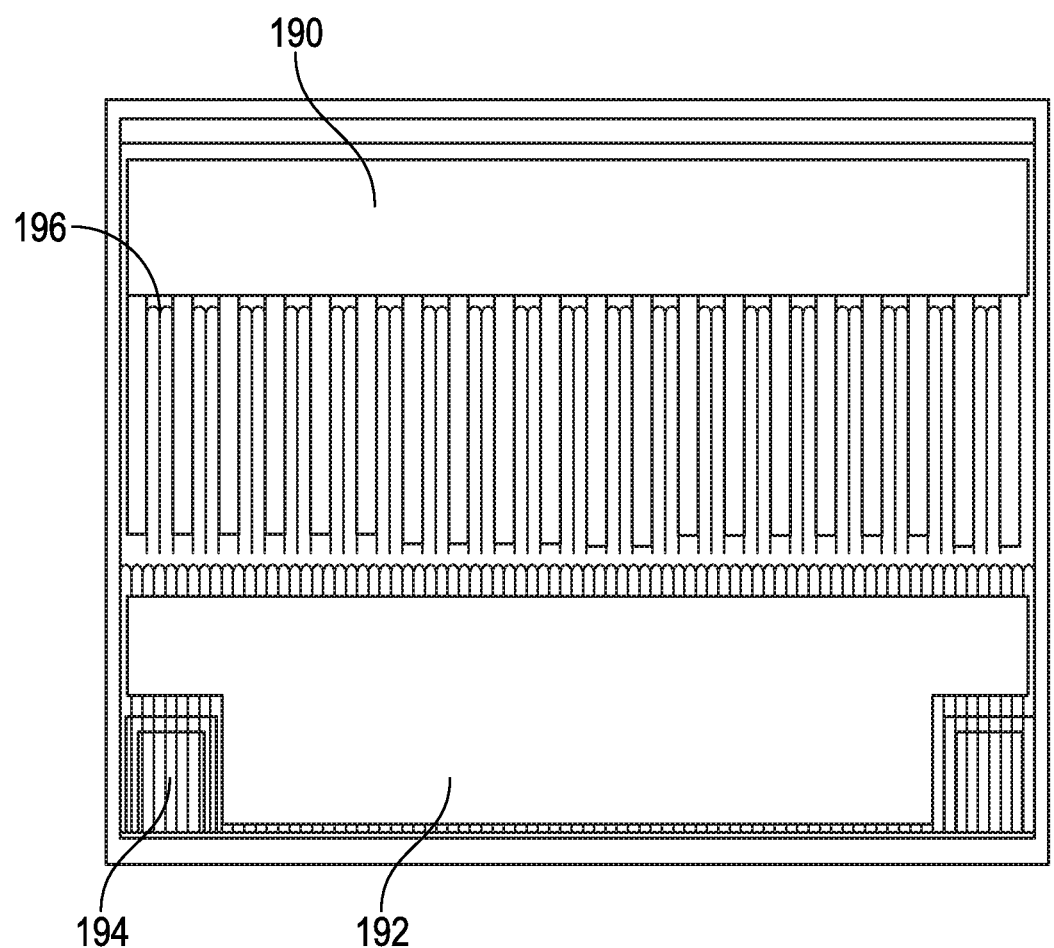
FIG. 13E is a top view of the pad metal from the device in FIG. 13A.

Referring now to FIGS. 13A-13E, an implementation of a semiconductor device 188 having a semi-BOA layout is illustrated. The drain pad 190 is located over the non-active area of the device while the source pad 192 and gate pads 194 are located over the active area of the device 188 (see also FIG. 13E). In FIG. 13B, an enlargement of an area from FIG. 13A is illustrated. The bottom of the drain pad 190 near the drain fingers 196 is shown. An enlargement of this area is shown in FIG. 13C. The drain finger 196 extends from the drain pad 190 to the under the source pad 192, as illustrated in FIG. 13D. In FIG. 13C, the drain finger is formed from ohmic metal, the first metal layer, and the second metal layer. The portion of the drain finger under the source pad may be formed from ohmic metal and the first metal layer. The top of the source pad 192 is also shown.

Various methods of manufacture for the semiconductor device implementations can be devised by those of ordinary skill in the art using the principles disclosed in this document.

In places where the description above refers to particular implementations of semiconductor devices having bond over active pad structures and implementing components, sub-components, methods and sub-methods, it should be readily apparent that a number of modifications may be made without departing from the spirit thereof and that these implementations, implementing components, sub-components, methods and sub-methods may be applied to other semiconductor devices.

What is claimed is:

1. A semiconductor device comprising:
   a plurality of cells, each cell comprising at least one drain finger, at least one source finger and at least one gate;
   at least one drain pad;
   a plurality of source pads;
   a gate bus coupled with the plurality of cells; and
   at least one gate pad coupled to the gate bus;
   wherein the drain pad is coupled to the at least one drain finger of each of the plurality of cells;
   wherein each of the plurality of source pads is coupled to at least one source finger of each of the plurality of cells; and
   wherein one of the drain pad, the plurality of source pads, and the gate pad is positioned over one of the drain finger, the source finger, and the gate.

2. The semiconductor device of claim 1, wherein the plurality of cells are gallium nitride (GaN) high-electron mobility transistors (HEMT).

3. The semiconductor device of claim 1, wherein the plurality of cells comprise a first group having a first length and a second group having a second length that is longer than the first length of the first group.

4. The semiconductor device of claim 3, wherein the at least one drain pad is positioned over the second group of cells having the second length.

5. The semiconductor device of claim 1, wherein a second drain pad is positioned opposite the at least one drain pad with the plurality of source pads between, the second drain pad coupled to the at least one drain pad through at least one drain bus.

6. The semiconductor device of claim 1, wherein the gate bus is located under the plurality of source pads.

7. The semiconductor device of claim 1, wherein the plurality of source pads are electrically coupled together during packaging.

8. The semiconductor of claim 7, wherein the plurality of source pads are coupled to one another through wire bonding.

9. A semiconductor device comprising:
   a plurality of cells, each cell comprising at least one drain finger, at least one source finger and at least one gate;
   at least one drain pad;
   a plurality of source pads;
   a gate bus coupled with the plurality of cells; and at least one gate pad coupled to the gate bus;
wherein the drain pad is coupled to the at least one drain finger of each of the plurality of cells;
wherein each of the plurality of source pads is coupled to at least one source finger of each of the plurality of cells;
wherein the plurality of source pads are electrically coupled together during packaging; and
wherein the plurality of cells comprise a first group having a first length and a second group having a second length that is longer than the first length of the first group.

10. The semiconductor device of claim 9, wherein the plurality of cells are gallium nitride (GaN) high-electron mobility transistors (HEMT).

11. The semiconductor device of claim 10, wherein the at least one drain pad is positioned over the second group of cells having the second length.

12. The semiconductor device of claim 9, wherein a second drain pad is positioned opposite the at least one drain pad with the plurality of source pads between, the second drain pad coupled to the at least one drain pad through at least one drain bus.

13. The semiconductor device of claim 9, wherein the gate bus is located under the plurality of source pads.

14. A semiconductor device comprising:
a plurality of cells, each cell comprising at least one drain finger, at least one source finger and at least one gate;
at least one drain pad;
a plurality of source pads;
a gate bus coupled with the plurality of cells; and
at least one gate pad coupled to the gate bus;
wherein the drain pad is coupled to the at least one drain finger of each of the plurality of cells;
wherein each of the plurality of source pads is coupled to at least one source finger of each of the plurality of cells; and
wherein the plurality of source pads are coupled to one another through one of wire bonding, bumps, and studs.

15. The semiconductor device of claim 14, wherein the plurality of cells are gallium nitride (GaN) high-electron mobility transistors (HEMT).

16. The semiconductor device of claim 14, wherein the plurality of cells comprise a first group having a first length and a second group having a second length that is longer than the first length of the first group.

17. The semiconductor device of claim 16, wherein the at least one drain pad is positioned over the second group of cells having the second length.

18. The semiconductor device of claim 14, wherein a second drain pad is positioned opposite the at least one drain pad with the plurality of source pads between, the second drain pad coupled to the at least one drain pad through at least one drain bus.

19. The semiconductor device of claim 14, wherein the gate bus is located under the plurality of source pads.

* * * * *